(12) United States Patent
Dudulwar et al.

(10) Patent No.: US 10,469,214 B1
(45) Date of Patent: Nov. 5, 2019

(54) CLOCK RECOVERY CIRCUIT AND METHOD OF OPERATING SAME

(71) Applicant: Intel Corporation, Santa Clara, CA (US)

(72) Inventors: Pankaj Dudulwar, Bangalore (IN); Mohit Verma, Bangalore (IN); Hongjiang Song, Mesa, AZ (US); Mingming Xu, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/219,441

(22) Filed: Dec. 13, 2018

(51) Int. Cl.
*H04L 1/20* (2006.01)
*H03L 7/07* (2006.01)
*G01R 31/317* (2006.01)

(52) U.S. Cl.
CPC ........ *H04L 1/205* (2013.01); *G01R 31/31709* (2013.01); *H03L 7/07* (2013.01)

(58) Field of Classification Search
CPC ...... H04L 1/205; G01R 31/31709; H03L 7/07
See application file for complete search history.

(56) References Cited

U.S. PATENT DOCUMENTS

| | | | | |
|---|---|---|---|---|
| 2008/0137790 A1* | 6/2008 | Cranford | ............... | H04L 7/0004 375/357 |
| 2013/0163706 A1* | 6/2013 | Tai | ........................ | H04L 7/0012 375/354 |
| 2014/0270030 A1* | 9/2014 | Hammad | ............... | H04L 7/0079 375/371 |
| 2016/0182065 A1* | 6/2016 | Wicpalek | ................ | H03L 7/099 327/156 |
| 2016/0218721 A1* | 7/2016 | Herbeck | ............... | H03L 7/0802 |

\* cited by examiner

*Primary Examiner* — Jaison Joseph
(74) *Attorney, Agent, or Firm* — Green, Howard & Mughal LLP (57) ABSTRACT

Techniques and mechanisms for a clock recovery circuit to generate a cyclical signal based on data signals which are susceptible to circuit switching jitter. In an embodiment, a clock recovery circuit comprises switch circuitry which receives a first signal representing a logical combination of multiple pulsed signals (which, in turn, are each based on a different respective differential data signal). The switch circuitry provides to latch circuitry of the clock recovery circuit a second signal based on the first signal. The latch circuitry generates a cyclical signal based on the second signal, and transitions the switch circuitry between an open-circuit state and a closed-circuit state. In another embodiment, the latch circuitry implements a predetermined and configurable time period between a transition of the cyclical signal and a next subsequent logic state transition of the cyclical signal.

22 Claims, 7 Drawing Sheets

CLOCK RECOVERY CIRCUIT AND METHOD OF OPERATING SAME

BACKGROUND

1. Technical Field

This disclosure generally relates to signal communications and more particularly, but not exclusively, to circuitry to generate a cyclical signal for clocking data signals.

2. Background Art

Mobile Industry Processor Interface (MIPI®) Alliance C-PHY is a high-speed serial physical layer (PHY) interface specification to provide high throughput performance over bandwidth limited channels for connecting to peripherals, including displays and cameras. C-PHY interfaces are based on a 3-phase symbol encoding technology for delivering high bits-per-symbol (e.g., 2.28 bits per symbol) communication using a three wire trio.

C-PHY interface was developed as a way to increase the efficiency of data rates using an encoding and decoding of data using three states of wires (high, mid, and low). C-PHY interfaces offer the advantage of a clock being embedded in cycles of a data communication. However, there is a significant disadvantage when it comes to the design implementation of C-PHY interface. For example, the high data rates of C-PHY communication tend to be limited by circuit switching jitter, resulting in signal eye closure and difficulties in clock recovery.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments described herein variously provide techniques and mechanisms for a circuit device (referred to herein as a "clock recovery circuit") to generate a cyclical signal based on data signals which are susceptible to circuit switching jitter. As used herein, "clock recovery" refers generally to operations/functionality for generating a cyclical signal which is to be used in signal latching and/or other timing operations. In an embodiment, such a cyclical signal facilitates the identification of data communicated by signaling which includes an embedded clock. The frequency $f_{cy}$ of such a cyclical signal corresponds to a frequency $f_{em}$ of the embedded clock—e.g., wherein $f_{cy}$ is equal to $N \cdot f_{em}$ (for some positive integer N). In an embodiment, a delay or phase of the cyclical signal is configurable by clock recovery circuitry to accommodate one or more delays in the communication and/or processing of data signals.

In various embodiments, a clock recovery circuit comprises first circuitry and second circuitry coupled thereto (referred to herein as "switch circuitry" and "latch circuitry," respectively), where the latch circuitry generates a cyclical signal based on a signal from the switch circuitry. The latch circuitry further signals the switch circuitry to transition between an open-circuit state and a closed-circuit state. Furthermore, the latch circuitry implements a predetermined—and in some embodiments, (re)configurable—time period between a logic state transition of the cyclical signal and a next subsequent logic state transition of the cyclical signal. As used herein with reference to a given digital signal "logic state transition" (or, for brevity, simply "transition") refers to a change of the signal from representing one Boolean logic state to a different Boolean logic state.

In an embodiment, such switch circuitry is coupled to receive a signal representing a logical combination of multiple pulsed signals which, in turn, are each based on a different respective differential data signal. As used herein, "differential data signal" (or, for brevity, simply "differential signal") refers to a signal which corresponds to two data signals, wherein a logic state of the differential data signal indicates a relationship, at a given time, between respective logic states of the two corresponding data signals. For example, a differential data signal may indicate whether, at a particular time, the logic state of a received data signal A is greater than the logic state of another received data signal B. The term "differential detector" refers herein to logic (e.g., circuitry) which is operable to detect such a relationship between data signals, and to generate a corresponding differential data signal.

Unless otherwise indicated, "pulsed signal" refers herein to a signal which communicates a pulse—e.g., including high-low-high transition sequence or, alternatively, a low-high-low transition sequence—in response to a logic state transition of a corresponding input signal (such as a differential data signal). A duration of such a pulse may be limited according to some predetermined threshold time. In an example embodiment, circuit logic (referred to herein as a "pulse generator") which is operable to generate a pulsed signal initiates the tolling of a delay period in response to a transition of the corresponding input signal. Such a delay is used to set a threshold maximum pulse duration—where the delay is (re)configurable over time to adjust the threshold.

As used herein, "combined pulsed signal" (or, for brevity, simply "combined signal") refers to a signal which represents a logical combination of multiple pulsed signals. In an example embodiment, combinatorial logic of a clock recovery circuit performs one or more Boolean operation (e.g., including an OR operation, a NOR operation, or the like) on such multiple pulsed signals to generate one combined signal, a pulse of which is based on one or more pulses of the multiple pulsed signals.

As used herein in the context of a clock recovery circuit, "switch circuitry" (unless otherwise indicated) refers to one or more switches, buffers, inverters, and/or other circuit components which, together, are operable to provide either of a closed-circuit state or an open-circuit state. The closed-circuit state enables a functionality of the switch circuitry to communicate with latch circuitry a signal which, for example, is based on a combined pulsed signal. An open-circuit state of such switch circuitry disables such communication with said latch circuitry.

In the context of a clock recovery circuit, "latch circuitry" (unless otherwise indicated) refers herein to circuit logic—e.g., comprising one or more D flip-flops and/or other suitable circuit components—which outputs a cyclical signal based on a signal provided by switch circuitry. Responsive to a logic state transition of a signal from such switch circuitry, the latch circuitry implements a corresponding transition of a cyclical signal. Furthermore, the latch circuitry is coupled to provide a feedback signal which selectively transitions said switch circuitry between an open-circuit state and a closed-circuit state. The latch circuitry comprises, for example, a delay line (and/or other suitable timing circuitry) which determines at least in part period of time before a next subsequent transition of the cyclical signal is to take place and—in some embodiments—before a next transition of the switch circuitry between the open-circuit state and the closed-circuit state.

Certain features of various embodiments are described herein with reference to clock recovery which is based on communications which are compatible with a camera PHY (C-PHY) specification—such as the C-PHY specification released Sep. 17, 2014 by the MIPI® Alliance—or any of a variety of differential PHY (D-PHY) standards of the MIPI® Alliance, such as the MIPI® Alliance Specification for D-PHY Version 0.9 of October, 2007, the MIPI® Alliance Specification for D-PHY Version 1.00.00 of May 14, 2009, the MIPI® Alliance Specification for D-PHY Version 1.1, approved on Dec. 16, 2011 or the like. However, such description may be extended to apply to clock recovery for any of a variety of additional or alternative types of a plurality of data signals which are based on an embedded clock encoding scheme.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including an interface for receiving communications which are based on an embedded clock coding scheme.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

It is pointed out that those elements of the figures having the same reference numbers (or names) as the elements of any other figure can operate or function in any manner similar to that described, but are not limited to such.

Figure 1:
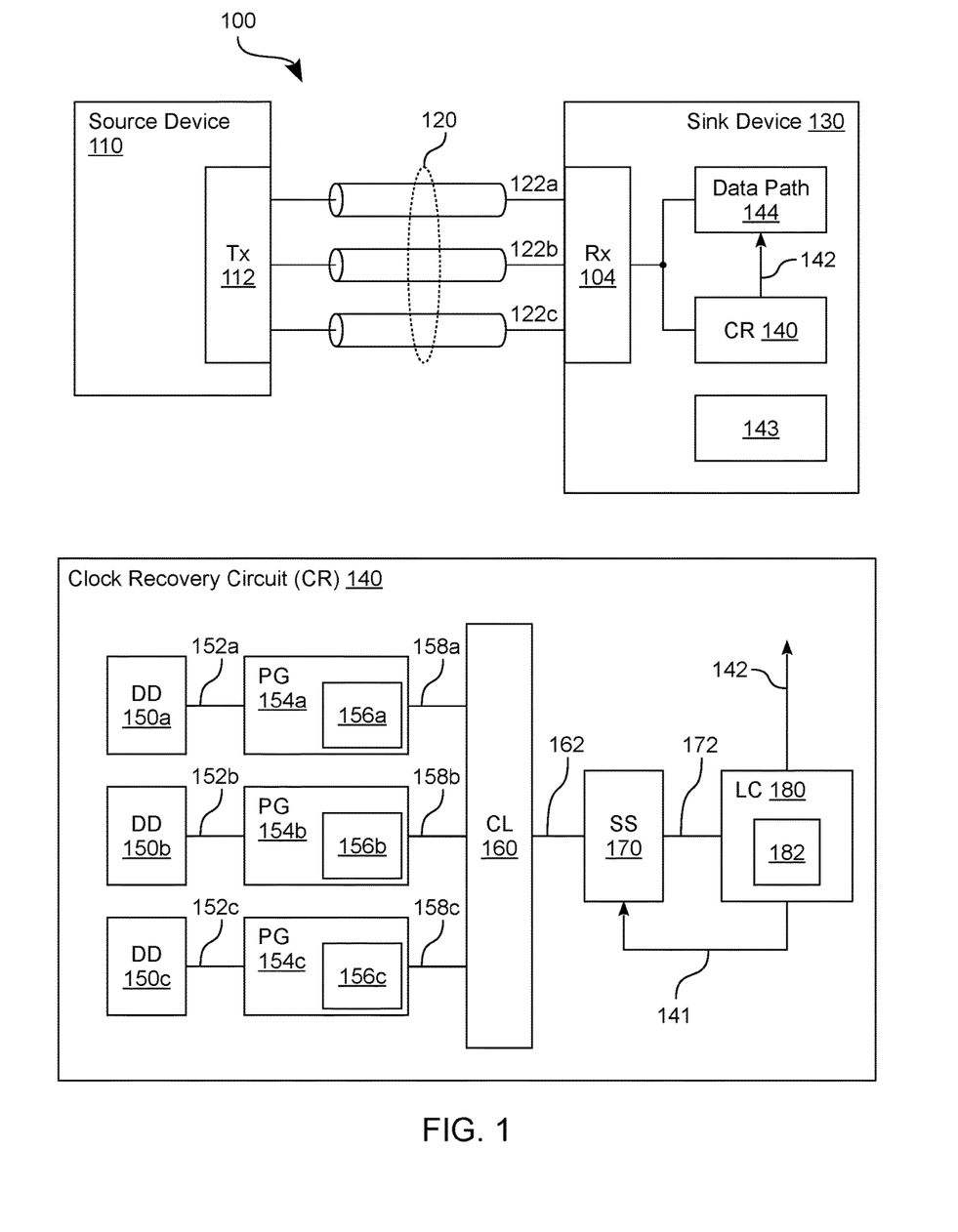
FIG. 1 shows functional block diagrams each illustrating respective elements of a system to determine a clock signal according to an embodiment.

FIG. 1 shows features of a system 100 to perform a clock signal recovery according to an embodiment. System 100 is one example of an embodiment wherein a clock recovery circuit comprises switch circuitry and latch circuitry coupled thereto, the switch circuitry to receive a signal representing a logical combination of pulsed signals which are each based on a different respective differential data signal. Based on a corresponding output signal from the switch circuitry, the latch circuitry generates a cyclical signal, where—responsive to a feedback from the latch circuitry—the switch circuitry is transitioned between an open-circuit state and a closed-circuit state. A predetermined signal delay implemented at the latch circuitry determines at least in part a period of time between two successive logic state transitions of the cyclical signal, as well as a period of time between two successive transitions by the switch circuitry between the open-circuit state and the closed-circuit state.

As shown in FIG. 1, system 100 includes a source device 110 comprising a transmitter (Tx) 112, a sink device 130 comprising a receiver (Rx) 104, and an interconnect 120 coupled between devices 110, 130, the interconnect 120 comprising multiple transmission lines (TLs) such as the illustrative TLs 122a, 122b, 122c shown. Communication between Tx 112 and Rx 104 via interconnect 120 may be compatible with a MIPI® C-PHY specification and/or a MIPI® D-PHY specification, although some embodiments are not limited in this regard. C-PHY, for example, is based on a 3-phase symbol encoding technology for delivering high bits per symbol over three wire trios—e.g., over TLs 122a, 122b, 122c. Here, Tx 112 transmits three signals $A_{Tx}$, $B_{Tx}$, and $C_{Tx}$ over the transmission lines to Rx 104. The voltage levels on the three transmission lines (i.e., TLs 122a, 122b, 122c) at the input of Rx 104 are $V_A$, $V_B$, and $V_C$, respectively. Here, voltage levels $V_A$, $V_B$, and $V_C$ are also interchangeably referred to as A, B, and C signals, respectively. In an embodiment, a communication of signals A, B and C with Tx 112 and Rx 104 is compatible with a MIPI® C-PHY specification (or with a MIPI® D-PHY specification), for example.

Signaling based on data signals A, B, C—e.g., including data signals A, B, C or differential signals based thereon—is communicated by Rx 104 to a data path 144 which, for example, includes flip-flops and/or other suitable circuitry to variously sample (e.g., latch) such signaling, selectively, according to a timing which is based on a cyclical signal 142. In an embodiment, signaling based on data signals A, B, C is also provided by Rx 104 to a clock recovery circuit CR 140 of sink device 130, where CR 140 generates cyclical signal 142 based on a timing of logic state transitions by the signaling. Generation of cyclical signal 142 is based on one or more predetermined timing delays which are implemented at CR 140. In some embodiments, some or all of said one or more predetermined timing delays are configurable (e.g., reconfigurable)—e.g., by control logic 143 comprising circuitry which monitors one or more operational characteristics based on cyclical signal 142.

As illustrated by the inset view in FIG. 1, an example embodiment of CR 140 comprises switch circuitry SS 170 and latch circuitry LC 180 coupled thereto, where SS 170 is coupled to receive a combined pulsed signal 162 and—during a closed-circuit state of SS 170—is to communicate to LC 180 a signal 172 which is based on signal 162. For example, SS 170 may be coupled to selectively pass signal 162 through to LC 180 or, alternatively, to selectively provide an inverted version of signal 162. LC 180 generates cyclical signal 142 based on signal 172—e.g., wherein LC 180 provides a transition of cyclical signal 142 in response to a transition of signal 172. A feedback signal 141—which, for example, includes or is otherwise based on cyclical signal 142—is communicated to transition SS 170 between a closed-circuit state and an open-circuit state.

Delay logic 182 of LC 180—e.g., comprising one or more delay line circuits—determines at least in part a preconfigured period of time, after a logic state transition of signal 172, before a next transition of cyclical signal 142 is to take place. Such delay logic 182 may further determine, at least in part, a preconfigured period of time before a next transition of SS 170 between the open-circuit state and the closed-circuit state. In one such embodiment, a first type of transitions (e.g., low-to-high transitions) of cyclical signal 142 are each in response to a corresponding transition of signal 172, where a second type of transitions (e.g., high-to-low transitions) of cyclical signal 142 are each in response to an expiration of a predetermined time after a most recent one of the first type of transitions. Cyclical signal 142 is communicated to data path 144 to enable sampling of data signals A, B, C—e.g., to facilitate the determination of data symbols communicated thereby. In an embodiment, such sampling based on cyclical signal 142 includes operations adapted from conventional D-PHY®, C-PHY®, or other signal processing techniques, which are not detailed herein to avoid obscuring certain features of various embodiments.

In some embodiments, clock recovery circuit CR 140 further comprises circuitry to generate signal 162 based on the data signals A, B, C received via TLs 122a, 122b, 122c. In an alternative embodiment, CR 140 omits, but is coupled to, such circuitry to generate signal 162. In the example embodiment shown, CR 140 comprises differential detectors (DDs) 150a, 150b, 150c which are each coupled to receive a different respective pair of data signals A, B, C (each from a corresponding pair of TLs 122a, 122b, 122c). Differential signals 152a, 152b, 152c—generated by DDs 150a, 150b, 150c, respectively—each indicate a respective relationship, at a given time, between the logic states of a corresponding pair of data signals A, B, C. Here, differential signal 152a indicates a difference between signals A and B (e.g., whether A>B), differential signal 152b indicates a difference between signals B and C (e.g., whether B>C), and differential signal 152c indicates a difference between signals C and A (e.g., whether C>A).

Switching jitter—by circuitry which generates or otherwise communicates signals A, B, and/or C—is prone to negatively impact differential signals 152a, 152b, 152c, as well as clock recovery based thereon. For example, due to the effects of switching jitter, a delay between respective signal transitions of a given two data signals can be up to 0.5 of a unit interval (UI) of an embedded clock—e.g., in a range of 0.1 UI to 0.45 UI and, in some embodiments, in a range of 0.2 UI to 0.4 UI. In some embodiments, mitigation of the effects of such jitter is facilitated—in combination with SS 170 and LC 180—by pulse generators (PGs) 154a, 154b, 154c which generate pulsed signals 158a, 158b, 158c (respectively) each based on a corresponding one of differential signals 152a, 152b, 152c. In an embodiment, a pulse of the pulsed signal 158a is provided by PG 154a in response to a transition of differential signal 152a, a pulse of the pulsed signal 158b is provided by PG 154b in response to a transition of differential signal 152b, and a pulse of the pulsed signal 158c is provided by PG 154c in response to a transition of differential signal 152c.

In an embodiment, pulses of pulsed signals 158a, 158b, 158c are variously limited in duration each based on respective delay circuitry 156a, 156b, 156c of PGs 154a, 154b, 154c. For example, the duration of a pulse of pulsed signal 158a is limited based on delay circuitry 156a applying a delay to at least some version of differential signals 152a. Similarly, the duration of a pulse of pulsed signal 158b may be limited based on delay circuitry 156b applying a delay to a version of differential signals 152b—e.g., wherein the duration of a pulse of pulsed signal 158c is limited based on delay circuitry 156c applying a delay to a version of differential signals 152c. In one example embodiment, a delay provided by one of delay circuitry 156a, 156b, 156c is up to 0.6 UI of the embedded clock for data signals A, B, C (e.g., where the delay in a range of 0.1 UI to 0.5 UI and, in some embodiments, in a range of 0.2 UI to 0.4 UI). In various embodiments, some or all of delay circuitry 156a, 156b, 156c are variously (re)configurable—e.g., by control logic 143—to adjust the application of such signal delays.

In an embodiment, combinatorial logic CL 160 of CR 140 is coupled to receive and perform one or more Boolean operations on pulsed signals 158a, 158b, 158c, wherein the one or more Boolean operations generate the combined pulsed signal 162. In an example embodiment, signal 162 represents an OR'ing of pulsed signals 158a, 158b, 158c, wherein—responsive to feedback signal 141—SS 170 selectively passes signal 162 as the output signal 172 during a closed-circuit state. Alternatively, signal 162 may represent a NOR'ing of pulsed signals 158a, 158b, 158c, wherein SS 170 includes an inverter circuit that—responsive to feedback signal 141—selectively outputs an inverted version of signal 162 as signal 172.

Using configurable delays for pulsed signals, and tightly coordinated inter-operation of switch circuitry and latch circuitry based on such signals, various embodiments enable clock recovery with improved accommodation for signal jitter. Such clock recovery facilitates high-frequency data signal sampling—e.g., at a rate of up to 2.5 giga-samples per second (Gsps) or more. In some embodiments, such sampling is at a rate which is in a range of 2.5 Gsps to 4.0 Gsps (e.g., in a range of 3.0 Gsps to 3.5 Gsps). By contrast, some conventional MIPI® C-PHY interfaces (for example) have difficulty supporting sampling at or above 2.5 Gsps, due to switching jitter and minimum eye width requirements.

Figure 2:
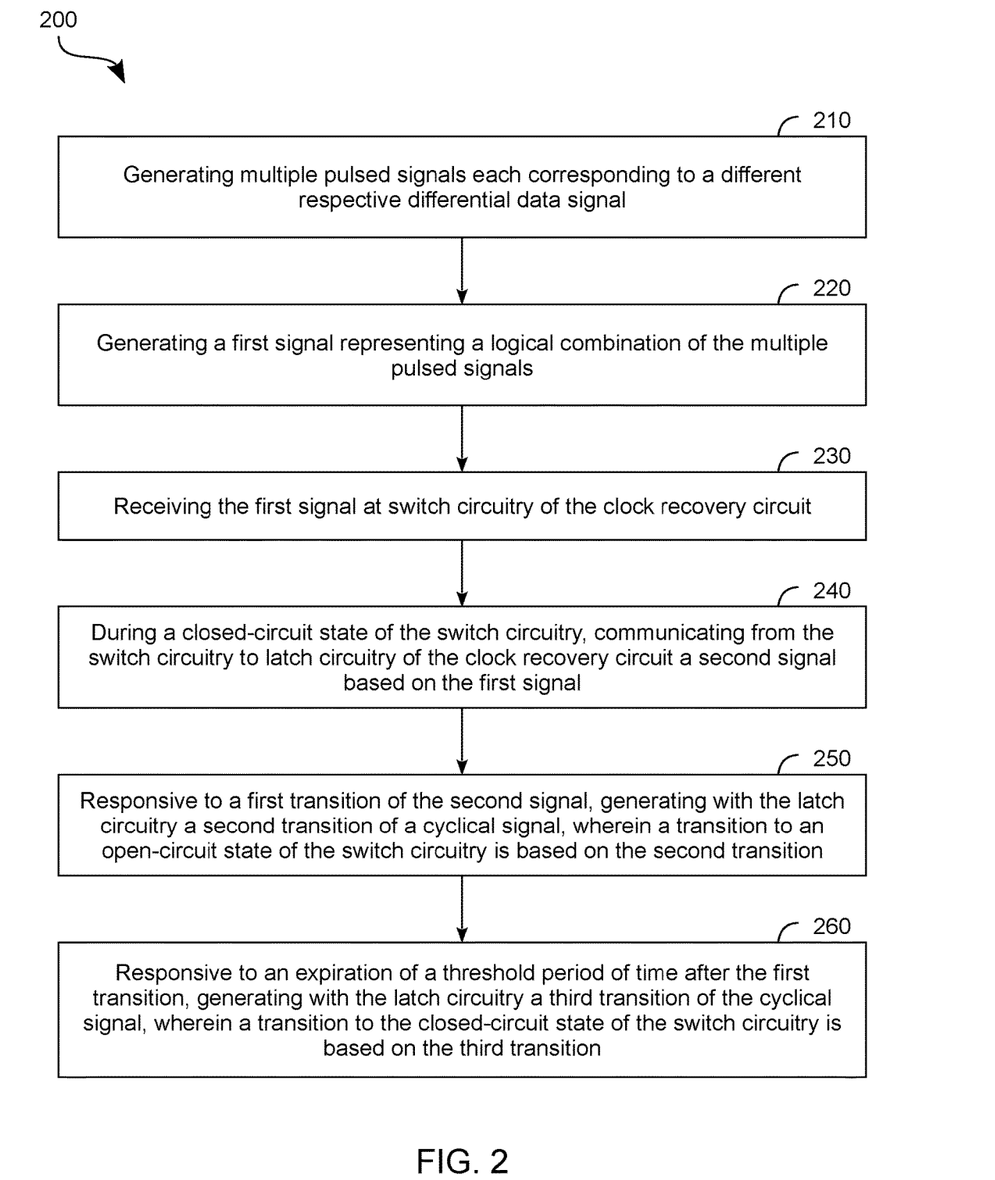
FIG. 2 is a flow diagram illustrating elements of a method for operating a clock recovery circuit according to an embodiment.

FIG. 2 shows features of a method 200 to generate a clock signal based on multiple data signals according to an embodiment. Method 200 may be performed with clock recovery circuit CR 140, for example. To illustrate certain features of various embodiments, method 200 is described herein with reference to the performance of a clock recovery with a circuit 300 shown in FIG. 3, and with further reference to a timing diagram 400 shown in FIG. 4. Timing diagram 400 illustrates an example embodiment wherein signals, over a period of time 402 (between a time to and a time t14), are variously communicated with circuit 300 to facilitate a clock recovery. The timing of said signals are shown relative to one unit interval (UI) of an embedded clock signal for which clock recovery is being performed. Circuit 300 may include some or all of the features clock recovery circuit CR 140, for example.

In some embodiments, method 200 comprises operations (e.g., including the illustrative operations 210, 220 shown) to generate a combined pulsed signal which, in turn is to be used in clock recovery operations of method 200. However, in other embodiments, method 200 omits, but is performed subsequent to—e.g., based on—such operations to generate a combined pulsed signal.

As shown in FIG. 2, method 200 comprises (at 210) generating multiple pulsed signals each corresponding to a different respective differential data signal. In an embodiment, generating the multiple pulsed signals at 210 comprises, for each pulsed signal of the multiple pulsed signals, limiting a duration of a pulse of the pulsed signal—e.g., where such limiting is based on the application of a time delay to a version of the corresponding differential data signal. For example, referring now to FIG. 3, functionality such as that of differential detectors 150a, 150b, 150c is provided at circuit 300 with differential amplifiers which are variously coupled to generate respective differential data signals AB, BC, CA each based on a corresponding pair of data signals A, B, C. In the example shown, transitions of a given one of data signals A, B, C (and thus, pulses of a given one of signals AB, BC, CA) occur no more than once per UI. In various other embodiments, one of data signals A, B, C may transition (and one of signals AB, BC, CA may pulse) multiple times in a single UI. In an embodiment, functionality such as that of pulse generators PG 154*a*, 154*b*, 154*c* is provided at circuit 300 with pulse generator circuits which are variously coupled to generate (at 210 of method 200, for example) respective pulsed signals XAB, XBC, XCA—e.g., signals 158*a*, 158*b*, 158*c*, respectively—each based on a corresponding one of differential data signals AB, BC, CA.

Figure 3:
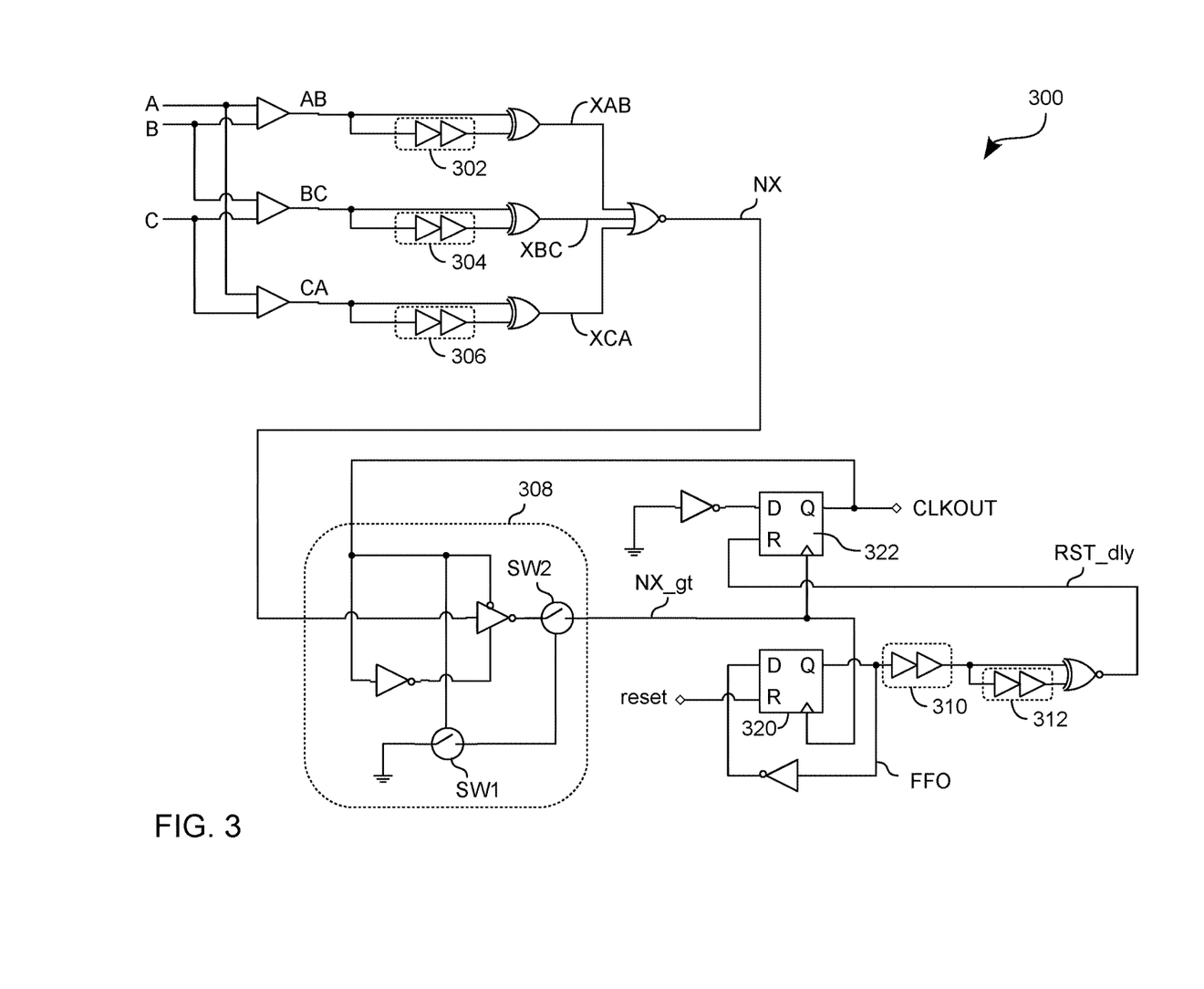
FIG. 3 is a circuit diagram illustrating elements of a circuit to generate a cyclical signal for clocking data according to an embodiment.

In the example embodiment of circuit 300, each such pulse generator comprises a respective XOR gate and a respective delay circuit coupled thereto, wherein the XOR gate outputs a pulsed signal which is based on both a corresponding differential data signal and a delayed version of that said signal. For example, a delay circuit 302 generates a delayed version AB_del of signal AB, where a delay circuit 304 generates a delayed version BC_del of signal BC, and a delay circuit 306 generates a delayed version CA_del of signal CA. In one such embodiment, a pulse by XAB is responsive to (e.g., begins upon) a corresponding transition by AB, and is to have a duration which is no longer than a predetermined limit provided with delay circuit 302. Similarly, a pulse by XBC is responsive to a corresponding transition by BC, and is to have a duration which is no longer than a predetermined limit provided with delay circuit 304—e.g., wherein a pulse by XCA is responsive to a corresponding transition by CA, and is to have a duration which is no longer than a predetermined limit provided with delay circuit 306. Delay circuits 302, 304, 306 are to provide functionality of delay circuitry 156*a*, 156*b*, 156*c*, for example. Some or all of the respective signal delays variously applied by delay circuits 302, 304, 306 may be reconfigurable over time—e.g., where reconfiguration of such delays contributes to clock recovery having greater or lesser tolerance for jitter in data signals A, B, C. For example, delay circuits 302, 304, 306 may each include a respective configurable delay line comprising a plurality of delay elements.

Referring again to FIG. 2, method 200 further comprises (at 220) generating a first signal—e.g., a combined pulsed signal—which represents a logical combination of the multiple pulsed signals generated at 210. In an embodiment, the first signal is generated with combinatorial logic which performs one or more Boolean operations on the multiple pulsed signals. For example, a NOR gate of circuit 300 (e.g., providing functionality of combinatorial logic 160) generates a combined pulsed signal NX which represents a NOR'ing of pulsed signals XAB, XBC, XCA.

Referring again to FIG. 2, method 200 comprises (at 230) receiving the first signal at switch circuitry of a clock recovery circuit. The switch circuitry is operable to provide either of a closed-circuit state or an open-circuit state—e.g., to enable or disable (respectively) communication of a second signal, which is based on the first signal, to latch circuitry of the clock recovery circuit. For example, method 200 further comprises (at 240) communicating a second signal from the switch circuitry to the latch circuitry during a closed-circuit state of the switch circuitry, wherein the second signal is based on the first signal.

In the example embodiment of circuit 300, switch circuitry 308 (e.g., providing functionality of SS 170) is coupled to receive signal NX and, during a closed-circuit state of switch circuitry 308, to communicate another signal NX_gt which is generated based on signal NX. In the example embodiment shown, signal NX_gt represents an inverted version of signal NX during the closed-circuit state of switch circuitry 308. By contrast, during the open-circuit state of switch circuitry 308, a logic state of signal NX_gt may be independent of a concurrent logic state (and/or any concurrent logic state transition) of signal NX.

Transitioning between the open-circuit state and closed-circuit state of switch circuitry 308 is provided, for example, with one or more switches (e.g., including the illustrative switches SW1, SW2 shown) which are responsive to feedback from the latch circuitry. Such feedback may include or otherwise be based on a cyclical signal CLKOUT which is generated by the latch circuitry based on the signal NX_gt. For example, referring again to FIG. 2, method 200 further comprises operations—by latch circuitry of the clock recovery circuit—to generate a cyclical signal which is based on the second signal. In an embodiment, such operations comprise (at 250) generating, responsive to a first transition of the second signal, a second transition of the cyclical signal, wherein the switch circuitry transitions to (e.g., configures) an open-circuit state based on the second transition of the cyclical signal. In an embodiment, such operations further comprise (at 260) generating a third transition of the cyclical signal responsive to an expiration of a threshold period of time after the first transition of the second signal, wherein a transition to the closed-circuit state of the switch circuitry is based on the third transition of the cyclical signal.

For example, referring again to the illustrative embodiment of circuit 300, latch circuitry coupled receive signal NX_gt comprises D flip-flops 320, 322, a delay circuit 310 and a pulse generator (comprising another delay circuit 312) which is coupled to provide a signal RST_dly for resetting D flip-flop 322. In such an embodiment, a transition of signal NX (during a closed-circuit state of switch circuitry 308) results in a corresponding transition of signal NX_gt, which in turn clocks each of D flip-flops 320, 322. Based on such clocking, D flip-flops 320, 322 each latch a respective input value to a corresponding output—e.g., to variously transition signals FFO, CLKOUT (respectively).

Latching D flip-flop 322 results in a logic state transition of a cyclical signal CLKOUT which, for example, is the cyclical signal generated with operations 250, 260 of method 200. A corresponding transition of signal FFO by D flip-flop 320 begins the tolling of a predetermined time period—provided with delay circuit 310—before a subsequent transition of RST_dly to reset D flip-flop 322 (and thus to implement a next subsequent transition of CLKOUT). Another predetermined period of time, provided with delay circuit 312, sets a maximum duration of a pulse by signal RST_dly. In an embodiment, an inverted version of signal FFO is provided as feedback to toggle D flip-flop 320 upon a next subsequent transition of signal NX_gt. In some embodiments, a reset signal input for D flip-flop 320 facilitates the setting of an initialization state of the clock recovery circuit.

Figure 4:
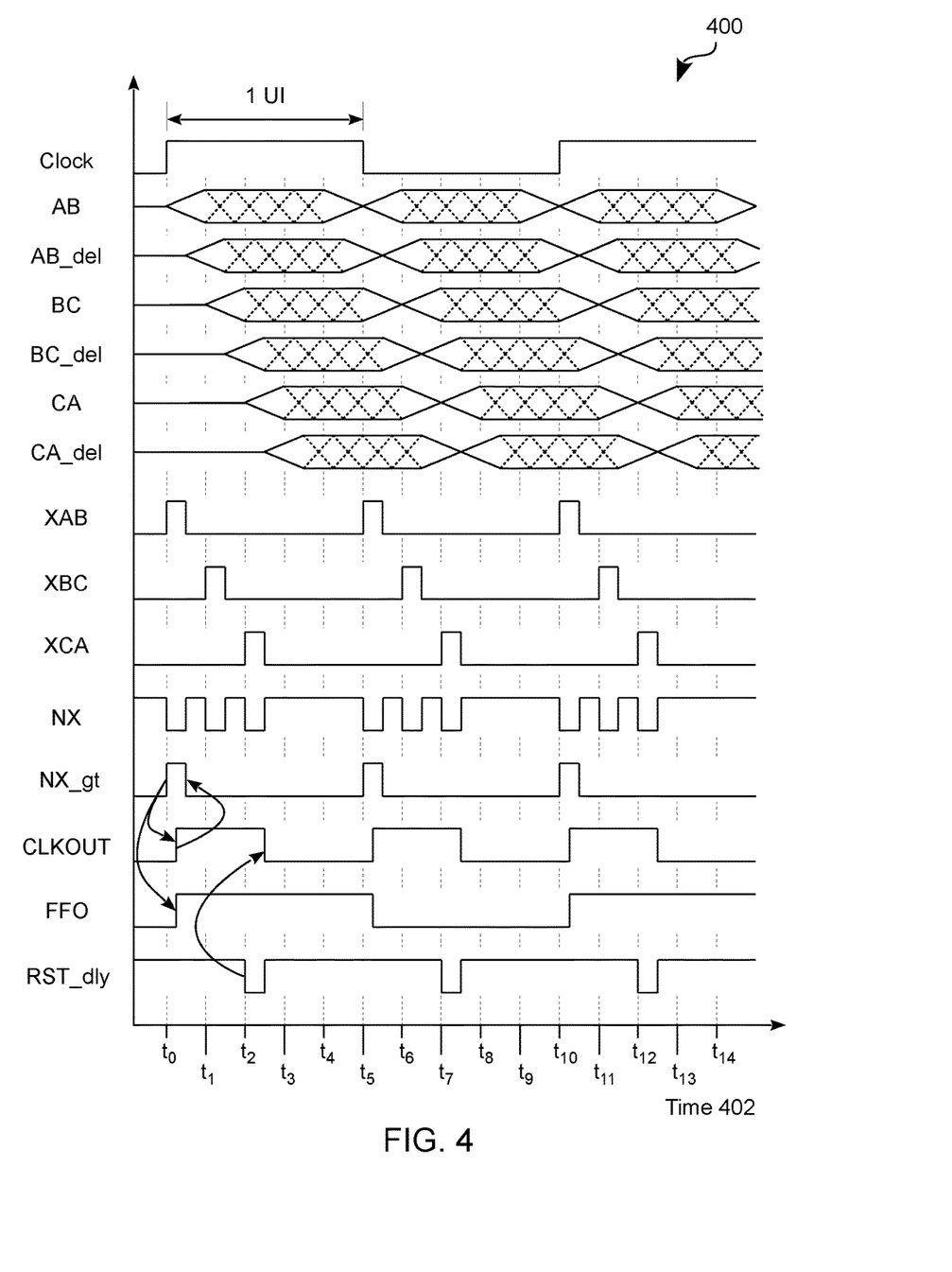
FIG. 4 is a timing diagram illustrating signals communicated with a clock recovery circuit according to an embodiment.

In the example embodiment illustrated by timing diagram 400, a low-to-high transition of CLKOUT is provided by D flip-flop 322 in response to a low-to-high transition of signal NX_gt (at time t0 in timing diagram 400). Such a low-to-high transition of CLKOUT results in an open-circuit state of switch circuitry 308, thereby mitigating the possibility of jitter by signal NX incorrectly causing an early logic state transition of CLKOUT. Due to the open-circuit state, any transition by signal NX which is within a threshold time period of a preceding transition by signal NX (e.g., the threshold time period implemented with delay circuit 310) will not cause respective transitions by signals NX_gt and CLKOUT. However, a next transition by signal NX which is after said threshold time period will cause respective transitions by signals NX_gt and CLKOUT.

After a predetermined time delay (between times $t_0$ and $t_2$ in timing diagram 400), a transition of signal RST_dly resets D flip-flop 322, resulting in a high-to-low transition of CLKOUT. Such a high-to-low transition of CLKOUT results in feedback to configure a closed-circuit state of switch circuitry 308, thereby enabling the communication of a transition by signal NX_gt based on some next transition of signal NX during the closed-circuit state. In the example embodiment, RST_dly transitions—e.g., at the illustrative time $t_2$ shown—to configure a closed-circuit state of switch circuitry 308 in time for a next pulse of signal XAB (at time $t_5$). Although the transition of RST_dly at time $t_2$ is shown as coinciding, for example, with a transition of signal XCA, some embodiments are not limited in this regard. As illustrated in timing diagram 400, a frequency of cyclical signal CLKOUT is an integer multiple of—e.g., double—the embedded clock frequency for the data signals A, B, C.

Figure 5:
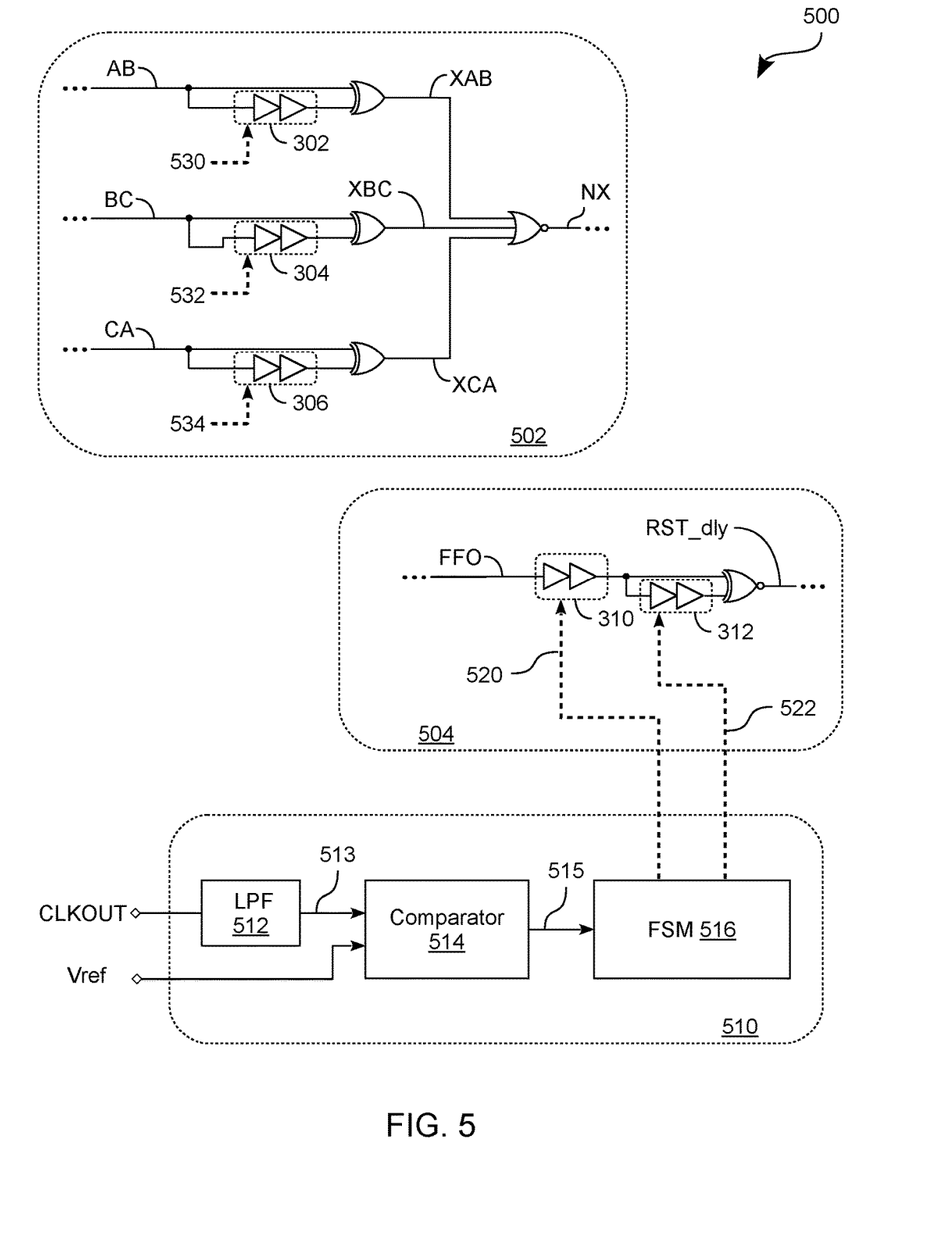
FIG. 5 is a functional block diagram illustrating elements of a circuit to generate a cyclical signal for clocking data signals according to an embodiment.

FIG. 5 shows features of a circuit 500 to configure clock recovery based on a trio of data signals according to an embodiment. Circuit 500 may include, or operate with, clock recovery circuitry such as that of circuit 300 or CR 140, for example. In some embodiments, circuit 500 configures the performance of a clock recovery according to method 200.

As shown in FIG. 5, circuit 500 includes control logic 510 (providing functionality of control logic 143, for example) which is coupled to monitor one or more characteristics of clock recovery circuitry, the one or more characteristics based on a cyclical signal which is generated by said clock recovery circuitry. Based on such monitoring, control logic 510 provides signaling to configure one or more signal delays which are each to be provided with a different respective delay line (or other configurable delay circuitry) of the clock recovery circuit.

To illustrate features of various embodiments, circuit 500 is shown as including (or alternatively, coupling to) a portion 504 of circuit 300 which comprises the latch circuitry to generate CLKOUT. In one such embodiment, circuit 500 further includes or couples to another portion 502 of circuit 300 which generates combined pulsed signal NX based on data signals A, B, C. However, control logic 510 may be coupled to configure any of various other clock recovery circuits according to different embodiments.

As shown in FIG. 5, control logic 510 comprises circuitry (such as that provided by the illustrative low pass filter 512 shown) to generate a signal 513 representing a smoothed or otherwise signal processed version of the cyclical signal CLKOUT. Based on signal 513 and some predefined reference criteria, an evaluation is made to determine whether one or more signal delays need to be adjusted. By way of illustration and not limitation, a comparator 514 of control logic 510 may perform a comparison based on one or more characteristics of cyclical signal CLKOUT, and further based on a criteria that, for example, is indicated by the illustrative reference voltage Vref shown.

In one embodiment, comparator 514 performs a duty cycle-to-voltage conversion and/or a phase-to-voltage conversion (for example), where such conversion determines a voltage level which is then compared to Vref. A result of the comparison is communicated via a signal 515 to other circuitry of control logic 510 (such as the illustrative finite state machine FSM 516 shown) which, in turn, generates control signaling based thereon. For example, in some embodiments FSM 516 generates, based on a comparison result indicated by signal 515, one or more control signals which are each to change or otherwise determine a signal delay to be provided with a respective delay circuit. In the example embodiment shown, delay circuits 302, 304, 306, 310, 312 are variously configured by respective control signals 530, 532, 534, 520, 522. In one such embodiment, control signals 530, 532, 534, 522 are actually the same one control signal, or otherwise communicate the same one time delay to be variously provided each with a corresponding one of delay circuits 302, 304, 306, 312.

Figure 6:
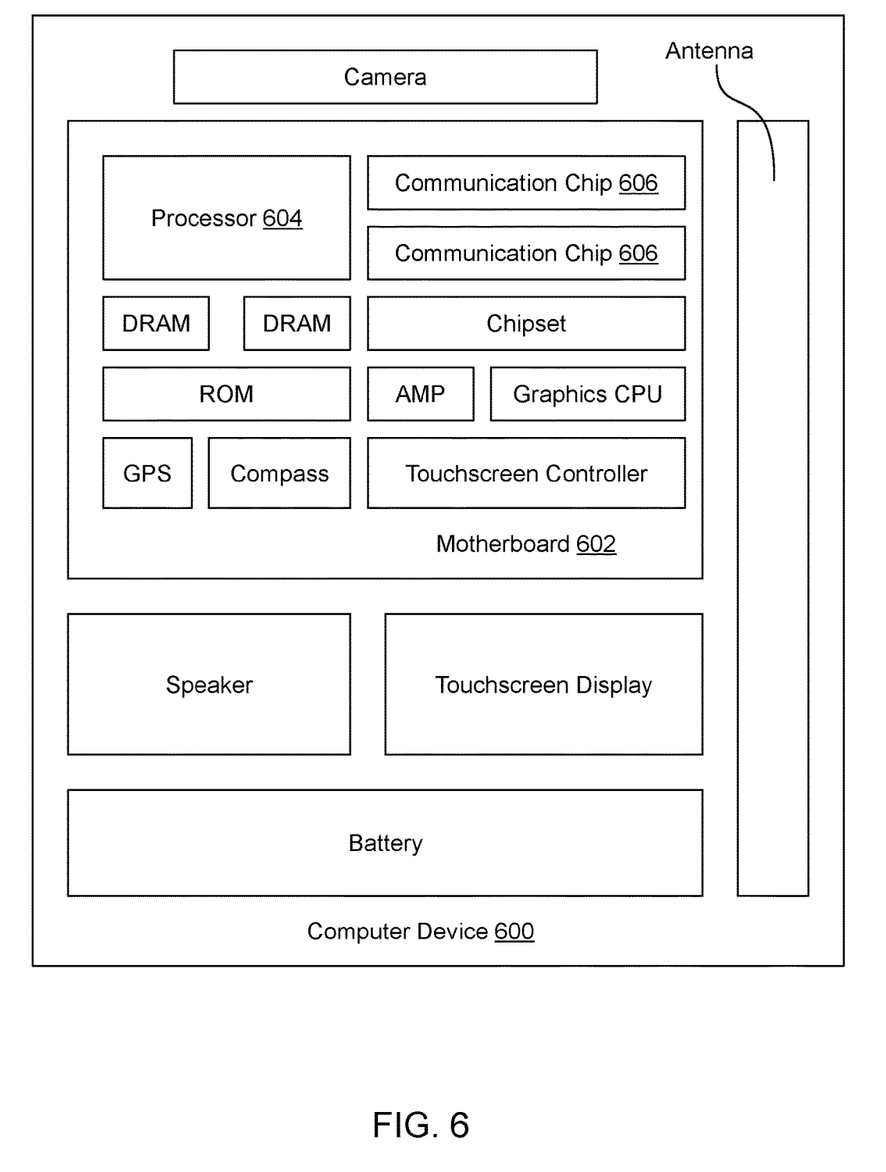
FIG. 6 is a functional block diagram illustrating a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
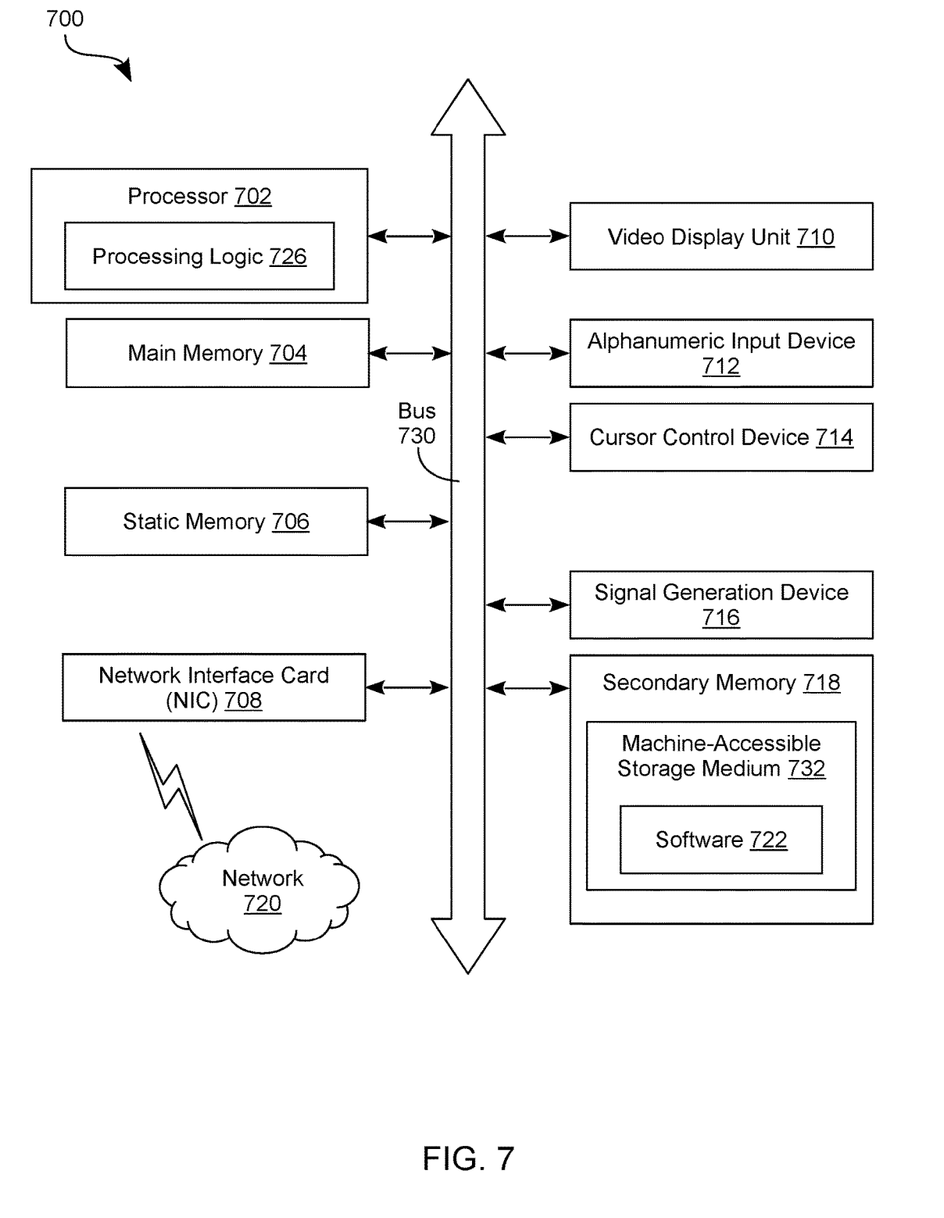
FIG. 7 is a functional block diagram illustrating an exemplary computer system, in accordance with one embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for performing a clock recovery are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A circuit comprising:
   first circuitry to receive a first signal, wherein the first signal is to represent a logical combination of second signals which each correspond to a different respective differential data signal; and
   second circuitry coupled to receive a third signal from the first circuitry during a closed-circuit state of the first circuitry, the third signal based on the first signal, the second circuitry further to generate a cyclical signal based on the third signal, wherein:
      the second circuitry is to generate, responsive to a first transition of the third signal, a second transition of the cyclical signal, wherein the first circuitry is further to transition to an open-circuit state based on the second transition of the cyclical signal; and
      the second circuitry is to generate a third transition of the cyclical signal responsive to an expiration of a threshold period of time after the first transition of the third signal, wherein the first circuitry is further to transition to the closed-circuit state based on the third transition of the cyclical signal.

2. The circuit of claim 1, further comprising circuitry to update the threshold period of time based on the cyclical signal.

3. The circuit of claim 1, further comprising circuitry to:
   receive multiple differential data signals;
   generate multiple pulsed signals each corresponding to a different respective differential data signal of the multiple differential data signals; and
   generate the first signal based on the multiple pulsed signals.

4. The circuit of claim 3, wherein the circuitry to generate the multiple pulsed signals comprises:
   circuitry which, for each pulsed signal of the multiple pulsed signals, is to limit a duration of a pulse of the pulsed signal based on an application of a respective time delay to a version of the corresponding differential data signal.

5. The circuit of claim 4, further comprising:
   for each differential data signal of the multiple differential data signals:
      circuitry to update, based on the cyclical signal, an amount of the respective time delay applied to the differential data signal.

6. The circuit of claim 4, further comprising circuitry to update the threshold period of time based on the cyclical signal.

7. The circuit of claim 1, further comprising circuitry to communicate the cyclical signal as a feedback to the switch circuitry.

8. The circuit of claim 1, further comprising circuitry to sample data signals based on the cyclical signal.

9. The circuit of claim 8, wherein a communication of the data signals is compatible with one of a MIPI camera physical layer interface specification or a MIPI differential physical layer interface specification.

10. The circuit of claim 8, wherein the circuitry to sample the data signals supports a sample rate which is in a range of 2.5 giga-samples per second (Gsps) to 4.0 Gsps.

11. The circuit of claim 8, wherein a frequency of the cyclical signal is two times a frequency of a frequency of an embedded clock indicated by the data signals.

12. A circuit comprising:
   first circuitry to generate three differential data signals each corresponding to a different respective pair of data signals;
   second circuitry coupled to receive the three differential data signals from the first circuitry, and to generate three pulsed signals each based on a different respective one of the three differential data signals; and
   third circuitry to generate a first signal to represent a logical combination of the three pulsed signals;
   fourth circuitry to receive the first signal and, during a closed-circuit state of the fourth circuitry, to output a second signal based on the first signal; and
   fifth circuitry coupled to receive the second signal from the fourth circuitry and to generate a cyclical signal based on the second signal, wherein:
      responsive to a first transition of the second signal, the fifth circuitry is to generate a second transition of the cyclical signal, wherein a transition to an open-circuit state of the fourth circuitry is to be based on the second transition; and
      responsive to an expiration of a threshold period of time after the first transition, the fifth circuitry is to generate a third transition of the cyclical signal, wherein a transition to the closed-circuit state of the fourth circuitry is to be based on the third transition.

13. The circuit of claim 12, further comprising circuitry to update the threshold period of time based on the cyclical signal.

14. The circuit of claim 12, wherein the second circuitry comprises:
   circuitry which, for each pulsed signal of the three pulsed signals, is to limit a duration of a pulse of the pulsed signal based on an application of a respective time delay to a version of the corresponding differential data signal.

15. The circuit of claim 14, further comprising:
   for each differential data signal of the three differential data signals:
      circuitry to update, based on the cyclical signal, an amount of the respective time delay applied to the differential data signal.

16. The circuit of claim 12, further comprising circuitry to sample data signals based on the cyclical signal.

17. The circuit of claim 16, wherein a communication of the data signals which is compatible with one of a MIPI camera physical layer interface specification or a MIPI differential physical layer interface specification.

18. A system comprising:
   a clock recovery circuit comprising:
      first circuitry to receive a first signal, wherein the first signal is to represent a logical combination of second signals which each correspond to a different respective differential data signal; and
      second circuitry coupled to receive a third signal from the first circuitry during a closed-circuit state of the first circuitry, the third signal based on the first signal, the second circuitry further to generate a cyclical signal based on the third signal, wherein:
         the second circuitry is to generate, responsive to a first transition of the third signal, a second transition of the cyclical signal, wherein the first circuitry is further to transition to an open-circuit state based on the second transition of the cyclical signal; and
         the second circuitry is to generate a third transition of the cyclical signal responsive to an expiration of a threshold period of time after the first transition of the third signal, wherein the first circuitry is further to transition to the closed-circuit state based on the third transition of the cyclical signal; and
   a display device coupled to the clock recovery circuit, the display device to display an image based data determined with the cyclical signal.

19. The system of claim 18, the clock recovery circuit further comprising circuitry to update the threshold period of time based on the cyclical signal.

20. The system of claim 18, the clock recovery circuit further comprising circuitry to:
   receive multiple differential data signals;
   generate multiple pulsed signals each corresponding to a different respective differential data signal of the multiple differential data signals; and
   generate the first signal based on the multiple pulsed signals.

21. The system of claim 20, wherein the circuitry to generate the multiple pulsed signals comprises:
   circuitry which, for each pulsed signal of the multiple pulsed signals, is to limit a duration of a pulse of the pulsed signal based on an application of a respective time delay to a version of the corresponding differential data signal.

22. The system of claim 21, the clock recovery circuit further comprising:
   for each differential data signal of the multiple differential data signals:
      circuitry to update, based on the cyclical signal, an amount of the respective time delay applied to the differential data signal.

\* \* \* \* \*